(12) United States Patent
Sakakura et al.

(10) Patent No.: US 10,187,991 B2
(45) Date of Patent: Jan. 22, 2019

(54) SUSPENSION BOARD WITH CIRCUIT AND PRODUCING METHOD THEREOF

(71) Applicant: NITTO DENKO CORPORATION, Osaka (JP)

(72) Inventors: Takatoshi Sakakura, Osaka (JP); Tomoaki Okuno, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 15/664,280

(22) Filed: Jul. 31, 2017

(65) Prior Publication Data

US 2018/0070448 A1 Mar. 8, 2018

(30) Foreign Application Priority Data

Sep. 7, 2016 (JP) ................... 2016-174434

(51) Int. Cl.
*H05K 1/18* (2006.01)
*H05K 1/16* (2006.01)
(Continued)

(52) U.S. Cl.
CPC ................ *H05K 1/16* (2013.01); *G11B 5/00* (2013.01); *H01L 41/047* (2013.01); *H01L 41/0475* (2013.01); *H05K 3/10* (2013.01); *H05K 3/4007* (2013.01); *H05K 1/056* (2013.01); *H05K 3/3431* (2013.01); *H05K 2201/10083* (2013.01); *H05K 2201/10287* (2013.01)

(58) Field of Classification Search
CPC .. H05K 1/00; H05K 1/02; H05K 1/05; H05K 1/11; H05K 1/18; H05K 1/115; H05K 3/06; H05K 3/10; H05K 3/18; H05K 3/28; H05K 3/30; H05K 3/40; H05K 3/42; G11B 5/48; G11B 5/60
USPC ........ 174/260, 250, 251, 255, 261, 264, 268; 29/846; 427/97.3, 97.4
See application file for complete search history.

(56) References Cited

U.S. PATENT DOCUMENTS

2011/0149440 A1 6/2011 Uematsu et al.
2012/0087041 A1\* 4/2012 Ohsawa ............... G11B 5/4826
360/234.5
(Continued)

FOREIGN PATENT DOCUMENTS

JP 2011-129220 A 6/2011
JP 2013-200909 A 10/2013
(Continued)

*Primary Examiner* — Xiaoliang Chen
(74) *Attorney, Agent, or Firm* — Edwards Neils, LLC; Jean C. Edwards, Esq.

(57) ABSTRACT

A suspension board with circuit includes a metal supporting layer, a base insulating layer, a conductive pattern including a wire, and a cover insulating layer. The conductive pattern includes a terminal for being connected to a piezoelectric element, connected to the wire, and disposed next to the base insulating layer in a direction perpendicular to the thickness direction. The terminal is exposed from the metal supporting layer and the base insulating layer when viewed from the other side in the thickness direction, and extends along the direction perpendicular to the thickness direction so as to go away from the base insulating layer next thereto. At least a portion of a peripheral end surface of the terminal is covered with the cover insulating layer.

2 Claims, 10 Drawing Sheets

(51) Int. Cl.
   *H01L 41/047*   (2006.01)
   *H05K 3/10*   (2006.01)
   *H05K 3/40*   (2006.01)
   *G11B 5/00*   (2006.01)
   *H05K 1/05*   (2006.01)
   *H05K 3/34*   (2006.01)

(56) References Cited

U.S. PATENT DOCUMENTS

| | | | | |
|---|---|---|---|---|
| 2012/0247824 A1* | 10/2012 | Ohsawa | ......... | G11B 5/486 174/264 |
| 2013/0014976 A1* | 1/2013 | Ishigaki | ......... | H05K 1/189 174/255 |
| 2013/0020112 A1* | 1/2013 | Ohsawa | ......... | G11B 5/4853 174/255 |
| 2013/0021699 A1* | 1/2013 | Ohsawa | ......... | G11B 5/4833 360/245.8 |
| 2013/0133939 A1* | 5/2013 | Ishii | ......... | H05K 1/115 174/262 |
| 2013/0248233 A1* | 9/2013 | Kanezaki | ......... | H05K 1/18 174/260 |
| 2013/0319743 A1* | 12/2013 | Ishii | ......... | H05K 1/0296 174/260 |
| 2013/0319748 A1* | 12/2013 | Ishii | ......... | H05K 1/0298 174/262 |
| 2014/0160599 A1* | 6/2014 | Higuchi | ......... | G11B 5/486 360/294.4 |
| 2015/0138739 A1* | 5/2015 | Hishiki | ......... | H05K 3/305 361/760 |
| 2015/0179196 A1* | 6/2015 | Okuno | ......... | G11B 5/4826 360/234.6 |
| 2015/0305156 A1* | 10/2015 | Fujimura | ......... | H05K 1/056 174/260 |
| 2015/0380030 A1* | 12/2015 | Sakakura | ......... | G11B 5/4873 174/251 |
| 2015/0382451 A1* | 12/2015 | Tanabe | ......... | H05K 3/28 174/251 |
| 2016/0007458 A1* | 1/2016 | Terada | ......... | H05K 1/181 174/268 |
| 2016/0035968 A1* | 2/2016 | Sakakura | ......... | H01L 41/313 29/25.35 |
| 2016/0081185 A1* | 3/2016 | Ishii | ......... | H05K 1/0296 174/255 |
| 2016/0105954 A1* | 4/2016 | Sugimoto | ......... | H05K 1/0271 174/251 |
| 2016/0111115 A1* | 4/2016 | Fujimura | ......... | G11B 5/4826 174/251 |
| 2016/0133284 A1* | 5/2016 | Terada | ......... | G11B 5/486 360/234.3 |
| 2016/0135296 A1* | 5/2016 | Takano | ......... | B23K 1/0056 361/760 |
| 2016/0239055 A1* | 8/2016 | Terada | ......... | G11B 5/4826 |
| 2016/0262265 A1* | 9/2016 | Tanabe | ......... | H05K 1/11 |
| 2017/0042024 A1* | 2/2017 | Sugimoto | ......... | H05K 1/05 |

FOREIGN PATENT DOCUMENTS

| | | |
|---|---|---|
| JP | 2014-106993 A | 6/2014 |
| JP | 2015-076107 A | 4/2015 |
| JP | 2015-082328 A | 4/2015 |
| JP | 2016-009513 A | 1/2016 |
| JP | 2016-018570 A | 2/2016 |

* cited by examiner

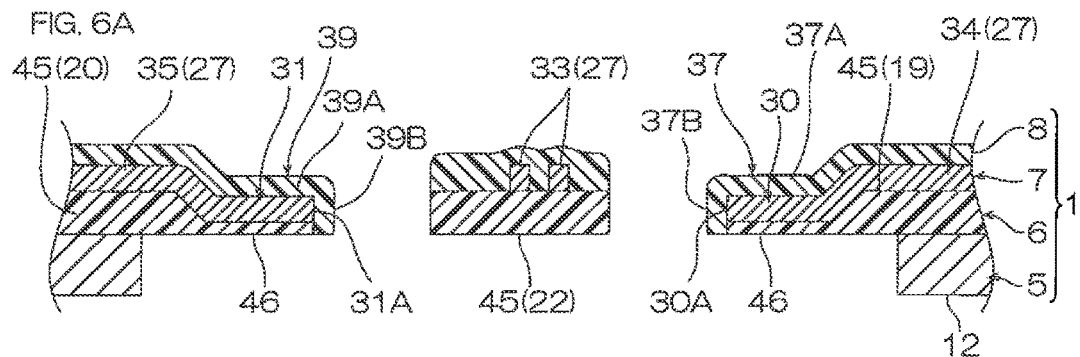
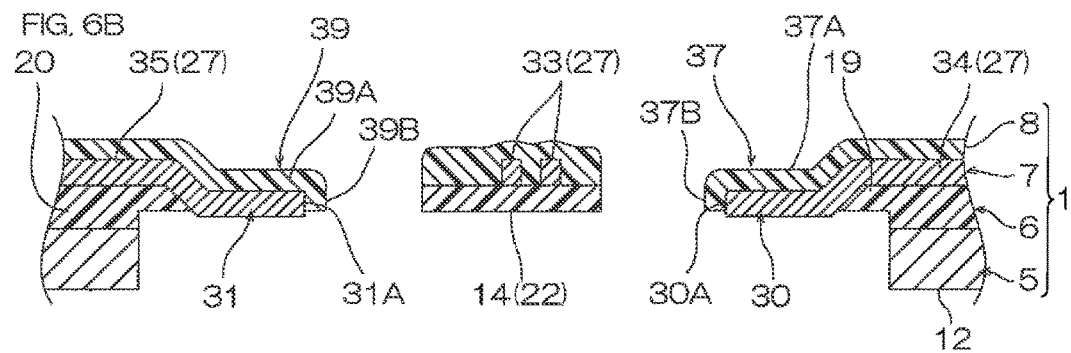
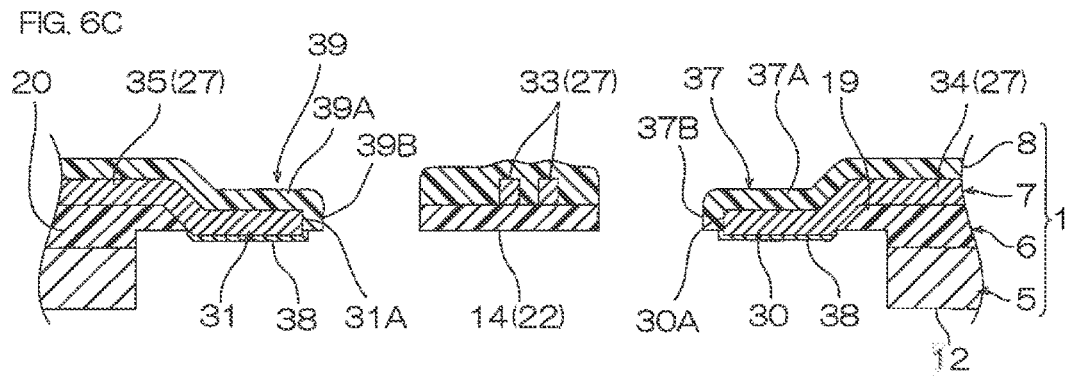

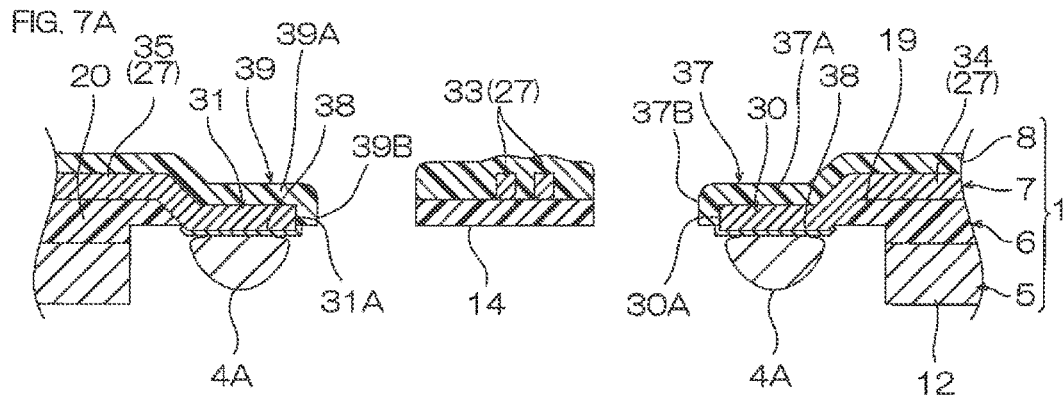
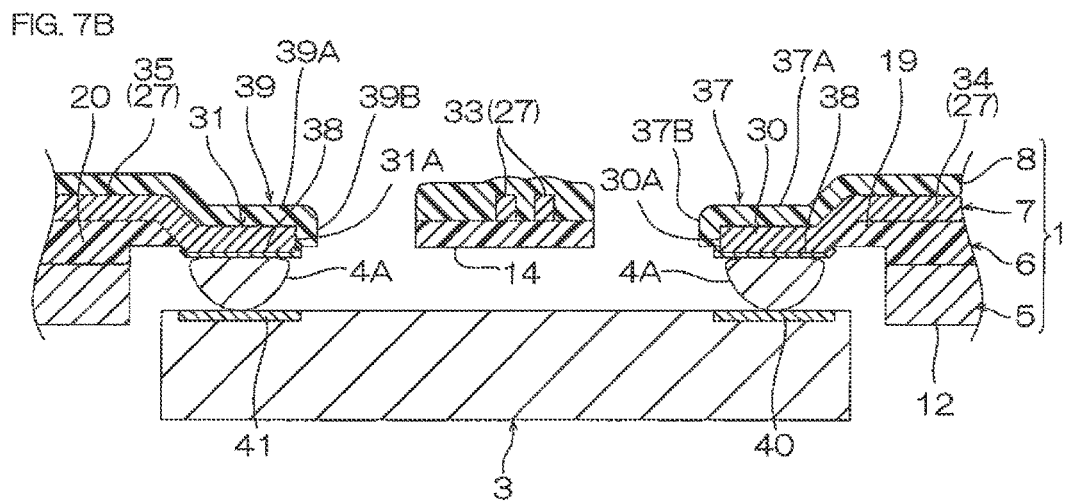
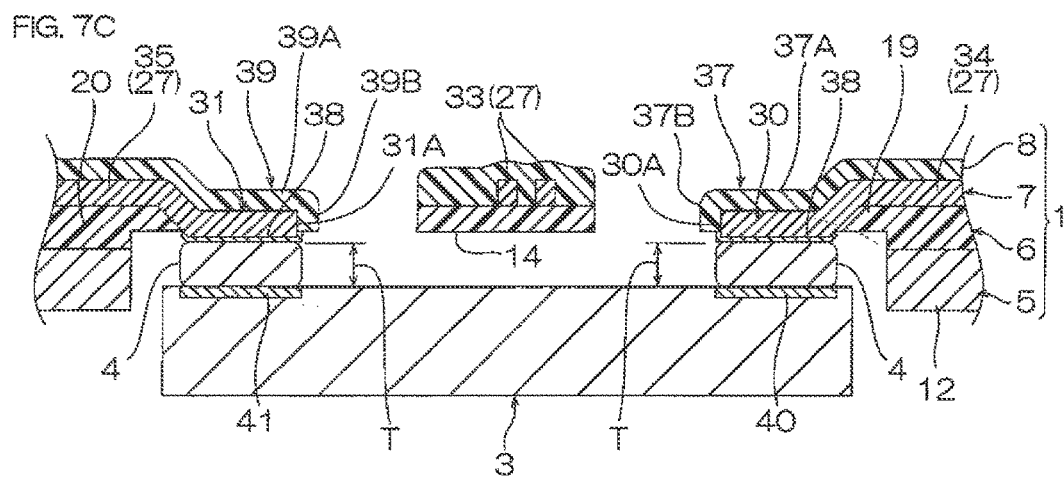

SUSPENSION BOARD WITH CIRCUIT AND PRODUCING METHOD THEREOF

CROSS-REFERENCE TO RELATED APPLICATION

The present application claims priority from Japanese Patent Application No. 2016-174434 filed on Sep. 7, 2016, the contents of which are hereby incorporated by reference into this application.

BACKGROUND OF THE INVENTION

Field of the Invention

The present invention relates to a suspension board with circuit, and a producing method thereof, to be more specific, a suspension board with circuit to be used for a hard disk drive, and a producing method thereof.

Description of Related Art

A suspension board with circuit on which a head slider, and a piezoelectric element that is extendable and/or contractable so as to displace the head slider are mounted has been known.

For example, it has been proposed that the piezoelectric element is connected to a piezoelectric-side terminal of the suspension board with circuit with an electrically conductive adhesive such as silver paste (ref: for example, Japanese Unexamined Patent Publication No. 2013-200909).

In such a method, after the electrically conductive adhesive is interposed between the piezoelectric-side terminal of the suspension board with circuit and a piezoelectric terminal of the piezoelectric element, the electrically conductive adhesive is melted by heating, and the piezoelectric-side terminal adheres to the piezoelectric terminal.

SUMMARY OF THE INVENTION

In the method described in Japanese Unexamined Patent Publication No. 2013-200909, there may be a case where the piezoelectric element deviates from a predetermined position, and by the subsequent heating, the piezoelectric-side terminal adheres to the piezoelectric terminal with the electrically conductive adhesive in a state where the piezoelectric element deviates from the predetermined position.

By taking such a case into account, it has been considered that solder is used as the electrically conductive adhesive, the piezoelectric element is self-aligned using the surface tension of the solder that is melted by heating, and improvement of the position accuracy of the piezoelectric element is achieved.

To subject the piezoelectric element to self-alignment accurately, it is required to sufficiently ensure the amount of solder that is interposed between the piezoelectric-side terminal and the piezoelectric terminal because the surface tension of the solder is in proportion to the volume thereof.

However, as shown in FIG. 10A, when a peripheral end surface 51A of a piezoelectric-side terminal 51 of a suspension board with circuit 50 is exposed, there is a disadvantage that solder 70 that is interposed between a piezoelectric terminal 61 of a piezoelectric element 60 and the piezoelectric-side terminal 51 wet-spreads so as to cover the peripheral end surface 51A of the piezoelectric-side terminal 51 at the time of melting by heating, so that the volume of the solder 70 between the piezoelectric terminal 61 and the piezoelectric-side terminal 51 is reduced.

In this case, the thickness of the solder 70 is reduced, and the surface tension of the solder 70 is reduced, so that it is difficult to subject the piezoelectric element 60 to self-alignment accurately, and there is a limit to the improvement of the position accuracy of the piezoelectric element 60.

Then, as shown in FIGS. 10B and 10C, it has been considered that the peripheral end surface 51A of the piezoelectric-side terminal 51 is covered with a base insulating layer 52 included in the suspension board with circuit 50.

As shown in FIG. 10B, for example, an opening 53 is formed in the base insulating layer 52, the piezoelectric-side terminal 51 fills the opening 53, and a continuous portion 54 that continues to the piezoelectric-side terminal 51 is disposed on the peripheral end portion of the opening 53 in the base insulating layer 52. In this manner, the peripheral end surface 51A of the piezoelectric-side terminal 51 is covered with the base insulating layer 52.

However, in the suspension board with circuit 50, in view of fine pitch of a conductive pattern, a wire 55 may be drawn around toward the neighborhood of the piezoelectric-side terminal 51. Also, in view of self-alignment of the piezoelectric element 60, an increase in the size of the piezoelectric-side terminal 51 is desired so at to achieve an increase in the volume of the solder 70 on the piezoelectric-side terminal 51.

Thus, the base insulating layer 52 on which the wire 55 is disposed gets closer to the base insulating layer 52 on which the continuous portion 54 is disposed, so that it may be difficult to ensure the structure of FIG. 10B.

Then, as shown in FIG. 10C, it has been considered that the continuous portion 54 that is positioned in the neighborhood of the wire 55 is removed to ensure a space. However, in the structure of FIG. 10C, the adhesive properties of the peripheral end surface 51A of the piezoelectric-side terminal 51 with the base insulating layer 52 covering the peripheral end surface 51A cannot be ensured, and there may be a case where the base insulating layer 52 is peeled from the peripheral end surface 51A or a gap occurs between the base insulating layer 52 and the peripheral end surface 51A.

The present invention provides a suspension board with circuit that is capable of achieving fine pitch of a conductive pattern and an increase in the size of a terminal, capable of stably covering at least a portion of a peripheral end surface of the terminal, and capable of being mounted with a piezoelectric element with excellent position accuracy, and a producing method thereof.

The present invention [1] includes a suspension board with circuit including a metal supporting layer, a base insulating layer disposed at one side in a thickness direction of the metal supporting layer, a conductive pattern including a wire disposed at one side in the thickness direction of the base insulating layer, and a cover insulating layer disposed at one side in the thickness direction of the base insulating layer so as to cover the wire, wherein the conductive pattern includes a terminal for being connected to a piezoelectric element, connected to the wire, and disposed next to the base insulating layer in a direction perpendicular to the thickness direction; the terminal is exposed from the metal supporting layer and the base insulating layer when viewed from the other side in the thickness direction, and extends along the direction perpendicular to the thickness direction so as to go away from the base insulating layer next thereto; and at least a portion of a peripheral end surface of the terminal is covered with the cover insulating layer.

According to the structure, at least a portion of the peripheral end surface of the terminal is covered with the cover insulating layer. Thus, when the piezoelectric element is mounted on the suspension board with circuit, wet-spreading of a solder composition that is positioned between the terminal of the suspension board with circuit and an element terminal of the piezoelectric element on the peripheral end surface of the terminal can be suppressed, and an amount of the solder composition that is positioned between the terminal and the element terminal can be surely ensured.

Also, the terminal extends along the direction perpendicular to the thickness direction so as to go away from the base insulating layer next thereto, so that compared to the above-described structure of FIG. 10B, the fine pitch of the conductive pattern and an increase in the size of the terminal can be achieved.

Also, the insulating layer covering the peripheral end surface of the terminal is the cover insulating layer, so that compared to the above-described structure of FIG. 10C, improvement of the adhesive properties of the cover insulating layer with the peripheral end surface of the terminal can be achieved.

As a result, the fine pitch of the conductive pattern and an increase in the size of the terminal can be achieved, at least a portion of the peripheral end surface of the terminal can be stably covered, and the piezoelectric element can be mounted with excellent position accuracy.

The present invention [2] includes the suspension board with circuit described in the above-described [1], wherein a size of the terminal in a width direction perpendicular to both directions of a direction in which the terminal extends and the thickness direction with respect to a size of the terminal in the direction in which the terminal extends is twice or more and 8 times or less.

According to the structure, the size of the terminal in the width direction with respect to that of the terminal in the direction in which the terminal extends is within the above-described range, so that an increase in the size of the terminal in the width direction can be achieved. Thus, when the piezoelectric element is mounted on the suspension board with circuit, improvement of the volume of the solder composition that can be disposed on the terminal can be achieved, and therefore, improvement of the position accuracy of the piezoelectric element can be achieved.

The present invention [3] includes a method for producing a suspension board with circuit including the steps of preparing a metal supporting layer, forming a base insulating layer at one side in a thickness direction of the metal supporting layer so as to form a thick portion and a thin portion by a gradation exposure to light, forming a wire at one side in the thickness direction of the thick portion and forming a terminal at one side in the thickness direction of the thin portion, forming a cover insulating layer at one side in the thickness direction of the base insulating layer so as to cover the wire, exposing the thin portion by removing the metal supporting layer, and exposing the terminal by removing the thin portion, wherein in the step of forming the base insulating layer, the thin portion is formed to extend along a direction perpendicular to the thickness direction so as to go away from the thick portion; in the step of forming the wire and the terminal, the terminal is formed at one side in the thickness direction of the thin portion so as to be next to the thick portion in the direction perpendicular to the thickness direction; and in the step of forming the cover insulating layer, the cover insulating layer is formed so as to cover at least a portion of a peripheral end surface of the terminal.

According to the method, after the base insulating layer is formed at one side in the thickness direction of the metal supporting layer so as to form the thick portion and the thin portion by the gradation exposure to light, the terminal is formed at one side in the thickness direction of the thin portion so as to be next to the thick portion in the direction perpendicular to the thickness direction, and next, the cover insulating layer is formed so as to cover at least a portion of the peripheral end surface of the terminal. Thereafter, the thin portion is exposed by removing the metal supporting layer, and then, the terminal is exposed by removing the thin portion.

In this manner, the suspension board with circuit in which the peripheral end surface of the terminal that extends so as to go away from the base insulating layer next thereto is covered with the cover insulating layer can be produced.

That is, the suspension board with circuit in which the fine pitch of the conductive pattern and an increase in the size of the terminal can be achieved, at least a portion of the peripheral end surface of the terminal can be stably covered, and the piezoelectric element can be mounted with excellent position accuracy can be smoothly produced.

BRIEF DESCRIPTION OF THE DRAWINGS

FIG. 6A, subsequent to FIG. 5D, shows a step of trimming the supporting board.

FIG. 6B, subsequent to FIG. 6A, shows a step of exposing the first terminal and the second terminal by removing the thin portion of the base insulating layer.

FIG. 6C, subsequent to FIG. 6B, shows a step of forming a plating layer on the first terminal and the second terminal.

FIG. 7A shows an explanatory view for illustrating a step of mounting a piezoelectric element on the suspension board with circuit shown in FIG. 6C, and shows a step of disposing a solder composition on the first terminal and the second terminal.

FIG. 7B, subsequent to FIG. 7A, shows a step of disposing the piezoelectric element so that a first element terminal and a second element terminal are in contact with the solder composition.

FIG. 7C, subsequent to FIG. 7B, shows a step of forming a solder layer by melting the solder composition.

DETAILED DESCRIPTION OF THE INVENTION

Figure 1:
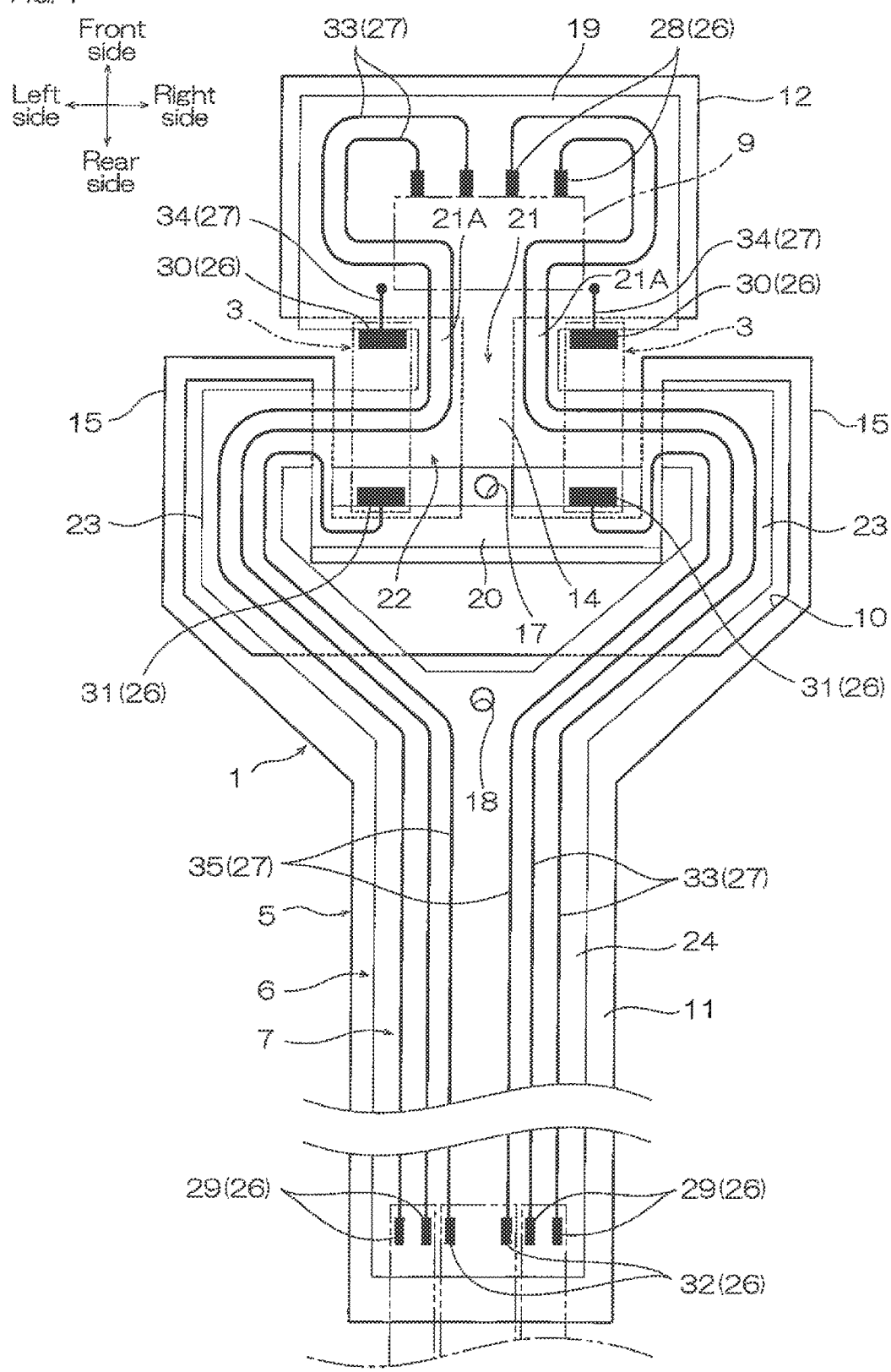
FIG. 1 shows a plan view of one embodiment of a suspension board with circuit of the present invention, and shows a state in which a cover insulating layer is removed.

In FIG. 1, the thickness direction of the paper surface is an up-down direction (first direction, thickness direction), the near side of the paper surface is an upper side (one side in the first direction, one side in the thickness direction), and the far side of the paper surface is a lower side (the other side in the first direction, the other side in the thickness direction).

In FIG. 1, the up-down direction of the paper surface is a front-rear direction (second direction perpendicular to the first direction, direction perpendicular to the thickness direction), the upper side of the paper surface is a front side (one side in the second direction, one side in the direction perpendicular to the thickness direction), and the lower side of the paper surface is a rear side (the other side in the second direction, the other side in the direction perpendicular to the thickness direction).

In FIG. 1, the right-left direction of the paper surface is a right-left direction (third direction perpendicular to both directions of the first direction and the second direction, width direction perpendicular to both directions of the thickness direction and the direction perpendicular to the thickness direction), the right side of the paper surface is a right side (one side in the third direction, one side in the width direction), and the left side of the paper surface is a left side (the other side in the third direction, the other side in the width direction). To be specific, the directions follow direction arrows described in each view.

1. Suspension Board with Circuit

Hereinafter, a suspension board with circuit 1 that is one embodiment of a suspension board with circuit of the present invention is described with reference to FIGS. 1 to 4B.

Figure 4A:
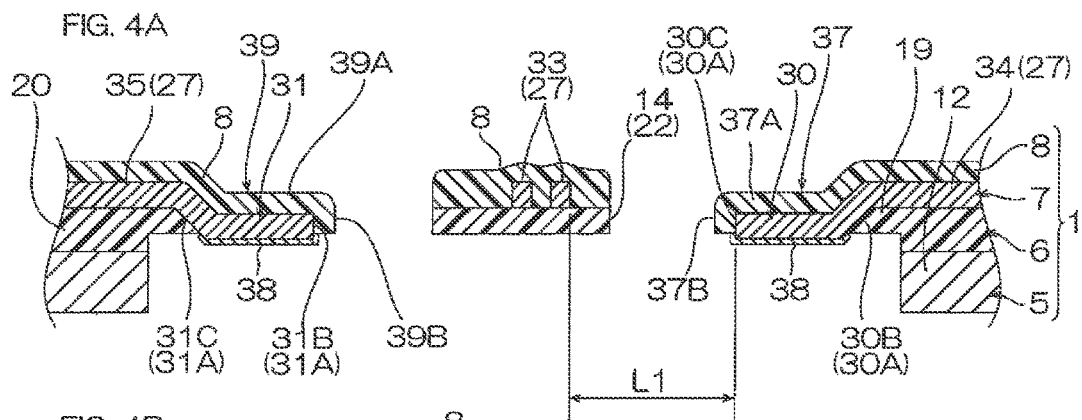
FIG. 4A shows an A-A cross-sectional view of the first terminal and a second terminal shown in FIG. 2.

As shown in FIG. 1, the suspension board with circuit 1 has a generally flat belt shape extending in the front-rear direction. As shown in FIG. 4A, the suspension board with circuit 1 has a laminate structure, and sequentially includes a supporting board 5 as one example of a metal supporting layer, a base insulating layer 6, a conductive pattern 7, and a cover insulating layer 8 from the lower side upwardly. In FIG. 1, for convenience, the cover insulating layer 8 is omitted.

Figure 2:
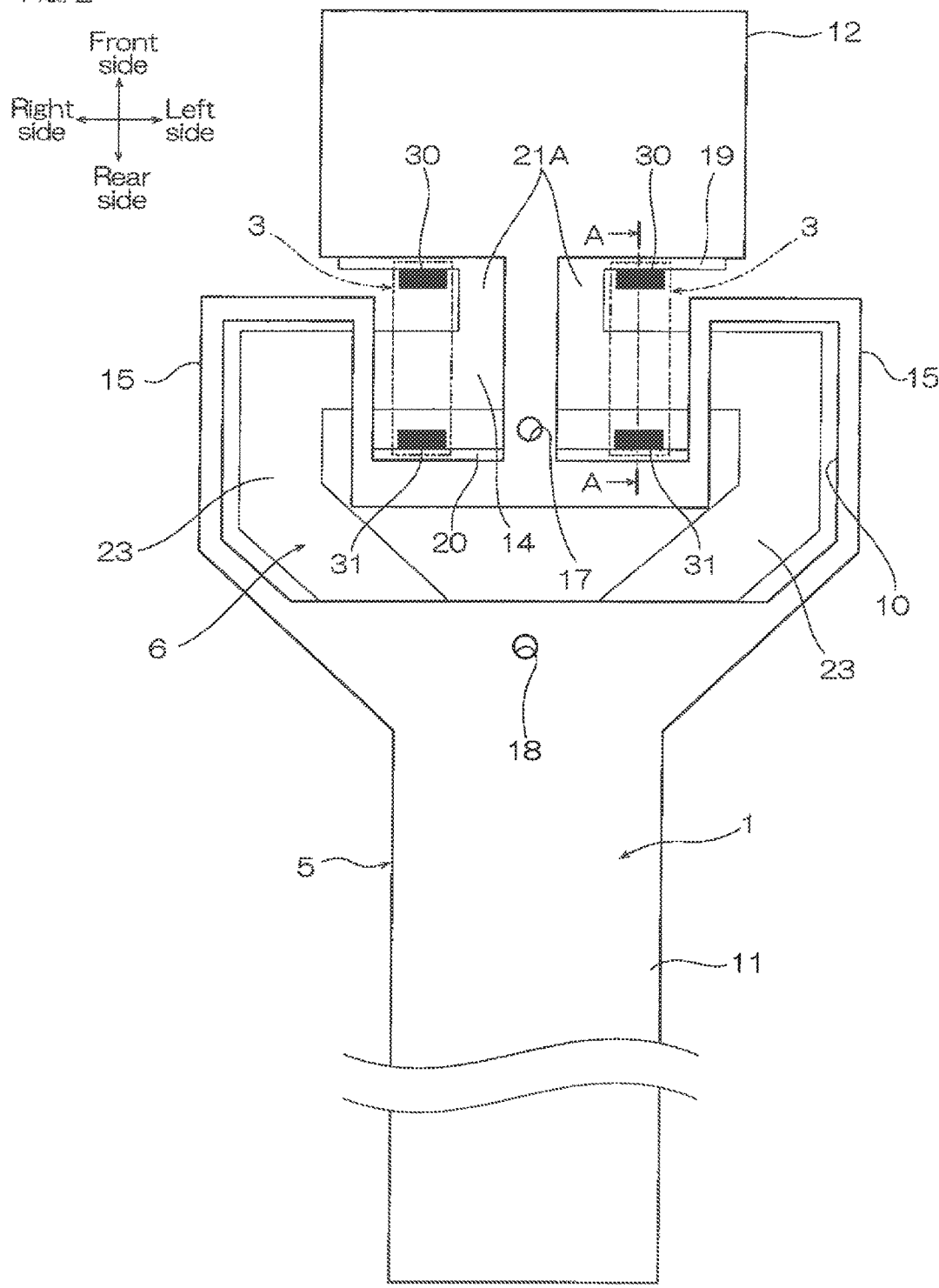
FIG. 2 shows a bottom view of the suspension board with circuit shown in FIG. 1.

As shown in FIG. 2, the supporting board 5 extends in the front-rear direction. The supporting board 5 includes a stage 12, two outriggers 15, and an external connecting portion 11.

The stage 12 is the front end portion of the supporting board 5, and has a generally H-shape when viewed from the top. To be more specific, each of the front-side portion and the rear-side portion of the stage 12 has a generally rectangular shape when viewed from the top extending in the right-left direction, and the front-side portion and the rear-side portion are connected to each other by the central portion having a generally rectangular shape extending in the front-rear direction.

The stage 12 has a first reference hole 17. The first reference hole 17 is formed in the central portion in the front-rear direction of the stage 12, and is positioned at the center in the right-left direction of the supporting board 5. The first reference hole 17 has a generally circular shape when viewed from the top, and passes through the stage 12 in the up-down direction.

Each of the two outriggers 15 has a generally U-shape having an opening rearwardly. Each of the outriggers 15 connects the end portion in the right-left direction of the rear-side portion of the stage 12 to the front end portion of the external connecting portion 11.

In this manner, an opening portion 10 which has a recessed shape having an opening forwardly is formed in the supporting board 5. The opening portion 10 is defined by the rear-side portion of the stage 12, the two outriggers 15, and the front end portion of the external connecting portion 11.

The external connecting portion 11 is a portion that is supported by a load beam (not shown), and is disposed at spaced intervals to the rear side of the stage 12. The external connecting portion 11 has a generally flat plate shape extending in the front-rear direction.

The external connecting portion 11 has a second reference hole 18. The second reference hole 18 is formed at the center in the right-left direction in the front end portion of the external connecting portion 11, and is positioned at the center in the right-left direction of the supporting board 5. The second reference hole 18 has a generally circular shape when viewed from the top, and passes through the external connecting portion 11 in the up-down direction.

The supporting board 5 is, for example, formed from a metal material such as stainless steel, 42-alloy, aluminum, copper-beryllium, and phosphor bronze. Preferably, the supporting board 5 is formed from stainless steel. The supporting board 5 has a thickness of, for example, 10 μm or more, preferably 15 μm or more, and for example, 35 μm or less, preferably 25 μm or less.

As shown in FIG. 4A, the base insulating layer 6 is disposed on the upper surface (one side in the thickness direction) of the supporting board 5, and as shown in FIG. 1, is provided as a predetermined pattern corresponding to the conductive pattern 7. The base insulating layer 6 includes a first stage base 19, a second stage base 22, a third stage base 20, two outrigger bases 23, and an external connecting base 24.

The first stage base 19 has a generally rectangular shape when viewed from the top, and is disposed on the upper surface of the front-side portion of the stage 12. The rear end edge of the first stage base 19 is positioned at the rear side with respect to the rear end edge of the front-side portion of the stage 12.

The second stage base 22 is disposed at the rear side with respect to the first stage base 19. The second stage base 22 has a generally T-shape when viewed from the top, and includes a belt-shaped portion 14 and a bridged portion 21.

The belt-shaped portion 14 has a flat belt shape extending in the right-left direction, and is disposed at spaced intervals to the rear side of the first stage base 19. Both end portions in the right-left direction of the belt-shaped portion 14 are positioned at the inside of the opening portion 10 when viewed from the upper side.

The bridged portion 21 is disposed between the first stage base 19 and the belt-shaped portion 14. The bridged portion 21 connects the central portion in the right-left direction of the rear end portion of the first stage base 19 to the central portion in the right-left direction of the front end portion of the belt-shaped portion 14.

A size in the right-left direction of the bridged portion 21 is larger than that in the right-left direction of the central portion of the stage 12. The central portion in the right-left direction of the bridged portion 21 is disposed on the central portion of the stage 12. Each of both end edges in the right-left direction of the bridged portion 21 is disposed at the outer side in the right-left direction with respect to both end edges in the right-left direction of the central portion of the stage 12. That is, the bridged portion 21 has two outer-side portions 21A that are positioned at the outer side in the right-left direction with respect to the central portion of the stage 12.

The third stage base 20 is disposed at spaced intervals to the rear side of the belt-shaped portion 14 of the second stage base 22, and is disposed on the upper surface of the rear-side portion of the stage 12. The third stage base 20 has a generally rectangular shape when viewed from the top extending in the right-left direction. The front end edge of the third stage base 20 is positioned at the front side with respect to the front end edge of the rear-side portion of the stage 12. Both end portions in the right-left direction of the third stage base 20 continue to the belt-shaped portion 14 on each of the outriggers 15.

The two outrigger bases 23 are positioned at the inside of the opening portion 10 when viewed from the upper side, and connect each of both end portions in the right-left direction of the belt-shaped portion 14 to the front end portion of the external connecting base 24.

The external connecting base 24 has a rectangular shape when viewed from the top extending in the front-rear direction, and is disposed on the upper surface of the external connecting portion 11.

The base insulating layer 6 is, for example, formed from a synthetic resin such as polyimide resin, polyamide imide resin, acrylic resin, polyether resin, nitrile resin, polyether sulfone resin, polyethylene terephthalate resin, polyethylene naphthalate resin, and polyvinyl chloride resin. Preferably, the base insulating layer 6 is formed from a polyimide resin.

The base insulating layer 6 has a thickness of, for example, 1 µm or more, preferably 3 µm or more, and for example, 25 µm or less, preferably 15 µm or less.

The conductive pattern 7 includes a terminal group 26 and a wire 27.

The terminal group 26 includes magnetic head terminals 28, external connecting terminals 29, first terminals 30 and second terminals 31 as one example of a terminal, and power source terminals 32.

The magnetic head terminals 28 are terminals for being connected to a terminal (not shown) of a slider 9. The plurality (four pieces) of magnetic head terminals 28 are disposed in alignment at spaced intervals to each other in the right-left direction on the first stage base 19.

The external connecting terminals 29 correspond to the plurality of magnetic head terminals 28, and the number thereof is the same as that of the magnetic head terminal 28. The plurality (four pieces) of external connecting terminals 29 are disposed in alignment at spaced intervals to each other in the right-left direction in the rear end portion of the external connecting base 24.

The first terminals 30 and the second terminals 31 are terminals for being connected to first element terminals 40 and second element terminals 41 (described later, ref: FIG. 4A) of a piezoelectric element 3 (described later). The number of the first terminal 30 and the second terminal 31 is the same as that of the piezoelectric element 3 that is mounted on the suspension board with circuit 1. Thus, when "n" piezoelectric elements 3 are mounted on the suspension board with circuit 1, "n" pairs of first terminal 30 and second terminal 31 are provided.

In the embodiment, the suspension board with circuit 1 is mounted with the two piezoelectric elements 3, so that the two pairs of first terminal 30 and second terminal 31 are provided. The two pairs of first terminal 30 and second terminal 31 are disposed at spaced intervals to each other in the right-left direction between the first stage base 19 and the third stage base 20.

The first terminal 30 and the second terminal 31 are disposed at spaced intervals to each other in the front-rear direction. The belt-shaped portion 14 of the second stage base 22 is disposed between the first terminal 30 and the second terminal 31 in the front-rear direction.

Figure 3:
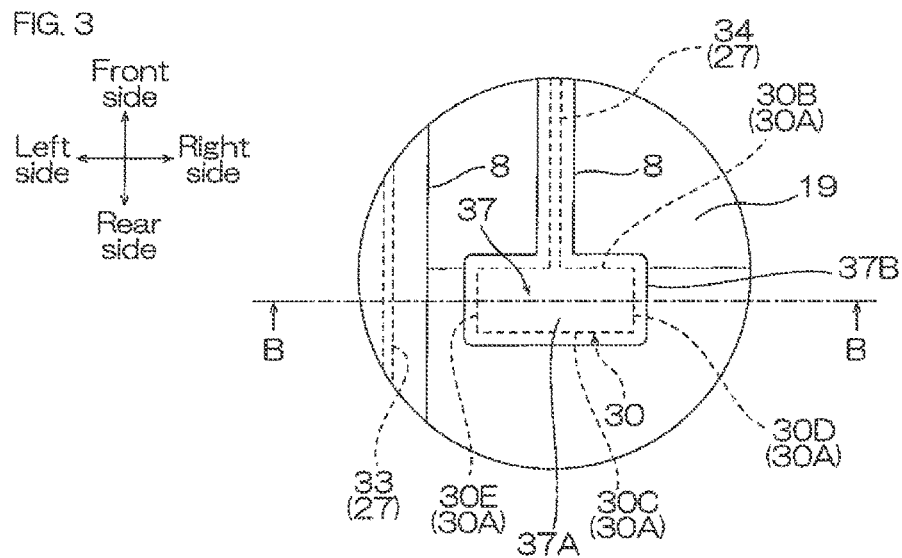
FIG. 3 shows an enlarged view of a first terminal shown in FIG. 1.

As shown in FIGS. 3 and 4A, the first terminal 30 has a generally rectangular shape when viewed from the top extending in the right-left direction. The first terminal 30 is next to the rear side with respect to the rear end edge of the first stage base 19, and is disposed at spaced intervals to the front side of the belt-shaped portion 14. That is, the first terminal 30 is next to the first stage base 19 in the front-rear direction.

Figure 4B:
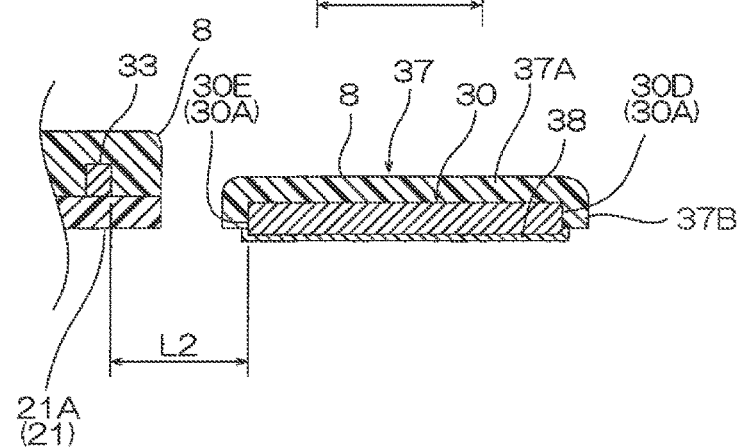
FIG. 4B shows a B-B cross-sectional view of the first terminal shown in FIG. 3.

As shown in FIG. 4B, the first terminal 30 is disposed at slightly spaced intervals to the outer side in the right-left direction of the outer-side portion 21A of the bridged portion 21.

As shown in FIG. 4A, the first terminal 30 extends rearwardly along the front-rear direction so as to go away from the first stage base 19. The rear end portion, and both end portions in the right-left direction of the first terminal 30 are free end portions, and are not connected to another portion of the conductive pattern 7.

In this manner, as shown in FIGS. 4A and 4B, a pheripheral end surface 30A of the first terminal 30 includes a front end surface 30B that is next to the first stage base 19 and a rear end surface 30C, a right end surface 30D, and a left end surface 30E that are not next to the base insulating layer 6.

Of the peripheral end surface 30A of the first terminal 30, the area of the portions that are not next to the base insulating layer 6 (to be specific, the total sum of the area of the rear end surface 30C, the right end surface 30D, and the left end surface 30E) with respect to the total area of the peripheral end surface 30A (to be specific, the total sum of the area of the front end surface 30B, the rear end surface 30C, the right end surface 30D, and the left end surface 30E) is, for example, 40% or more, preferably 45% or more, and for example, 90% or less, preferably 85% or less.

The first terminal 30 is exposed from the supporting board 5 and the base insulating layer 6 when viewed from the lower side (the other side in the thickness direction).

The first terminal 30 has a size in the front-rear direction of, for example, 30 µm or more, preferably 50 µm or more, and for example, 100 µm or less, preferably 90 µm or less, further more preferably 80 µm or less.

The first terminal 30 has a size in the right-left direction of, for example, 120 μm or more, preferably 210 μm or more, and for example, 250 μm or less, preferably 230 μm or less.

The size in the right-left direction of the first terminal 30 with respect to the size in the front-rear direction of the first terminal 30 is, for example, 1.2 times or more, preferably 1.5 times or more, further more preferably twice or more, and for example, 10 times or less, preferably 8 times or less, further more preferably 4 times or less.

The first terminal 30 has the area of, for example, 0.001 mm² or more, preferably 0.01 mm² or more, and for example, 0.025 mm² or less, preferably 0.020 mm² or less.

As shown in FIG. 1, the second terminal 31 has a generally rectangular shape when viewed from the top extending in the right-left direction. The second terminal 31 is disposed so that the central portion in the right-left direction thereof is positioned on a phantom line along the front-rear direction which passes the central portion in the right-left direction of the first terminal 30.

As shown in FIG. 4A, the second terminal 31 is next to the front side with respect to the front end edge of the third stage base 20, and is disposed at spaced intervals to the rear side of the belt-shaped portion 14. That is, the second terminal 31 is next to the third stage base 20 in the front-rear direction.

The second terminal 31 extends forwardly along the front-rear direction so as to go away from the third stage base 20. The front end portion and both end portions in the right-left direction of the second terminal 31 are free end portions, and are not connected to another portion of the conductive pattern 7.

In this manner, a peripheral end surface 31A of the second terminal 31 includes a rear end surface 31C that is next to the third stage base 20 and a front end surface 31B, a right end surface (not shown), and a left end surface (not shown) that are not next to the base insulating layer 6. The range of the area of the portions that are not next to the base insulating layer 6 of the peripheral end surface 31A of the second terminal 31 is the same as that of the area of the portions that are not next to the base insulating layer 6 of the peripheral end surface 30A of the first terminal 30 described above.

The second terminal 31 is exposed from the supporting board 5 and the base insulating layer 6 when viewed from the lower side (the other side in the thickness direction).

The range of the size of the second terminal 31 (size in the front-rear direction and size in the right-left direction) is the same as that of the size of the first terminal 30 described above. The range of the area of the second terminal 31 is the same as that of the area of the first terminal 30 described above.

A plating layer 38 is provided on each of the lower surfaces of the first terminal 30 and the second terminal 31. The plating layer 38 is, for example, formed from a metal material such as nickel and gold. Preferably, the plating layer 38 is formed from gold. The plating layer 38 has a thickness of, for example, 0.1 μm or more, preferably 0.25 μm or more, and for example, 5 μm or less, preferably 2.5 μm or less.

Figure 9:
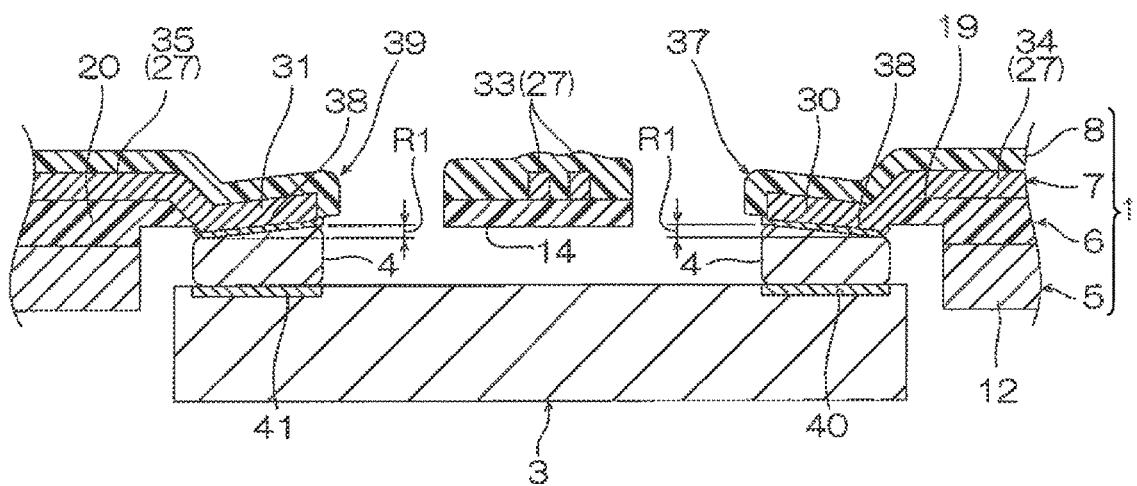
FIG. 9 shows an explanatory view for illustrating the shape and arrangement of the first terminal and the second terminal shown in FIG. 4A.

In the embodiment, each of the first terminal 30 and the second terminal 31 has a generally flat shape extending in the front-rear direction. As shown in FIG. 9, the "generally flat shape" means that an interval in the up-down direction between a portion positioned uppermost and a portion positioned lowermost of the lower surface of each of the first terminal 30 and the second terminal 31 (to be more specific, the lower surfaces of the plating layer 38) is within a range of 0 μm or more and 10 μm or less (in FIG. 9, referred to as R1). Thus, even when the first terminal 30 and the second terminal 31 slightly bend, the shape is included in the generally flat shape as long as the above-described interval is within the range R1.

As shown in FIG. 1, the power source terminals 32 correspond to the second terminals 31, and the number thereof is the same as that of the second terminal 31. In the embodiment, the two power source terminals 32 are provided corresponding to the two second terminals 31. The two power source terminals 32 are disposed between the external connecting terminals 29 in the rear end portion of the external connecting base 24. The two power source terminals 32 are disposed at spaced intervals to each other in the right-left direction.

As shown in FIG. 4A, the wire 27 is disposed on the upper surface (one side in the thickness direction) of the base insulating layer 6. As shown in FIG. 1, the wire 27 includes signal wires 33, ground wires 34, and power source wires 35.

The signal wires 33 correspond to the magnetic head terminals 28, and the number thereof is the same as that of the magnetic head terminal 28. The signal wire 33 electrically connects the magnetic head terminal 28 to the external connecting terminal 29. To be more specific, the signal wire 33 continues from the magnetic head terminal 28 and is drawn around on the first stage base 19; then, sequentially passes on the outer-side portion 21A of the bridged portion 21, the second stage base 22, the outrigger base 23, and the external connecting base 24; and thereafter, is connected to the external connecting terminal 29.

In this manner, in the embodiment, the plurality of signal wires 33 are drawn around so as to pass between the two first terminals 30 in the right-left direction, and then, are drawn around so as to pass between the first terminal 30 and the second terminal 31 in the front-rear direction.

Thus, as shown in FIGS. 4A and 4B, the rear end surface 30C of the first terminal 30 and the signal wire 33 are spaced apart from each other with an interval L1 therebetween in the front-rear direction. The left end surface 30E of the first terminal 30 and the signal wire 33 are spaced apart from each other with an interval L2 therebetween in the right-left direction.

The interval L in the front-rear direction between the rear end surface 30C of the first terminal 30 and the signal wire 33 (to be more specific, the signal wire 33 that is closest to the first terminal 30 in the front-rear direction) is, for example, 200 μm or more, preferably 250 m or more, and for example, 400 μm or less, preferably 350 μm or less.

The interval L2 in the right-left direction between the left end surface 30E of the first terminal 30 and the signal wire 33 (to be more specific, the signal wire 33 that is closest to the first terminal 30 in the right-left direction) is, for example, 20 μm or more, preferably 30 μm or more, and for example, 200 μm or less, preferably 100 μm or less.

As shown in FIG. 1, the ground wires 34 correspond to the first terminals 30, and the number thereof is the same as that of the first terminal 30. The ground wire 34 electrically connects the first terminal 30 to the supporting board 5. To be more specific, the ground wire 34 extends continuously from the first terminal 30 forwardly; is disposed on the first stage base 19; and then, passes through the first stage base 19 to be in contact with (grounded to) the stage 12.

The power source wires 35 correspond to the second terminals 31, and the number thereof is the same as that of the second terminal 31. The power source wire 35 electrically connects the second terminal 31 to the power source terminal 32. To be more specific, as shown in FIG. 4A, the power source wire 35 extends continuously from the second terminal 31 rearwardly; is disposed on the third stage base 20; and then, as shown in FIG. 1, sequentially passes on the outrigger base 23 and the external connecting base 24 to be connected to the power source terminal 32.

The conductive pattern 7 is, for example, formed from a conductive material such as copper, nickel, gold, and solder or an alloy thereof. Preferably, the conductive pattern 7 is formed from copper.

The conductive pattern 7 has a thickness of; for example, 1 μm or more, preferably 3 μm or more, and for example, 20 μm or less, preferably 12 pun or less.

As shown in FIGS. 4A and 4B, the cover insulating layer 8 is disposed on the upper surface (one side in the thickness direction) of the base insulating layer 6 so as to cover the wire 27. The cover insulating layer 8 has a pattern shape in which the magnetic head terminal 28, the external connecting terminal 29, and the power source terminal 32 are exposed, and the first terminal 30 and the second terminal 31 are covered when viewed from the upper side (one side in the thickness direction).

To be more specific, the cover insulating layer 8 covers at least a portion of the peripheral end surface of the first terminal 30 and at least a portion of the peripheral end surface of the second terminal 31, in addition to the upper surface of the first terminal 30 and the upper surface of the second terminal 31.

The cover insulating layer 8 includes first terminal covers 37 and second terminal covers 39.

The first terminal cover 37 is a portion that covers the first terminal 30 of the cover insulating layer 8. The first terminal cover 37 includes a first upper surface cover 37A and a first peripheral surface cover 37B.

The first upper surface cover 37A covers the upper surface of the first terminal 30, and is disposed on the upper surface (one side in the thickness direction) of the first terminal 30. The first upper surface cover 37A is disposed on at least the peripheral edge portions (to be specific, the rear end portion, the right end portion, and the left end portion of the upper surface) continuing to the portions (to be specific, the rear end surface 30C, the right end surface 30D, and the left end surface 30E) of the peripheral end surface 30A that are not next to the base insulating layer 6 of the upper surface of the first terminal 30. In the embodiment, the first upper surface cover 37A expands on the entire upper surface of the first terminal 30.

The first peripheral surface cover 37B covers a portion that is not next to the base insulating layer 6 of the peripheral end surface 30A of the first terminal 30, and is disposed on the peripheral end surface 30A. The first peripheral surface cover 37B continues from the peripheral end portion of the first upper surface cover 37A and extends downwardly. In the embodiment, the first peripheral surface cover 37B covers at least a portion of the rear end surface 30C, the right end surface 30D, and the left end surface 30E.

The area of the peripheral end surface 30A that is covered with the first peripheral surface cover 37B with respect to 100% of the entire area of the peripheral end surface 30A (to be specific, the total sum of the area of the front end surface 30B, the rear end surface 30C, the right end surface 30D, and the left end surface 30E) is, for example, 15% or more, preferably 25% or more, and for example, 90% or less, preferably 80% or less.

The area of the peripheral end surface 30A that is covered with the first peripheral surface cover 37B with respect to 100% of the area of the portion that is not next to the base insulating layer 6 of the peripheral end surface 30A of the first terminal 30 (to be specific, the total sum of the area of the rear end surface 30C, the right end surface 30D, and the left end surface 30E) is, for example, 30% or more, preferably 40% or more, and for example, 95% or less, preferably 90% or less.

The second terminal cover 39 is a portion that covers the second terminal 31 of the cover insulating layer 8. The second terminal cover 39 includes a second upper surface cover 39A and a second peripheral surface cover 39B.

The second upper surface cover 39A covers the upper surface of the second terminal 31, and is disposed on the upper surface (one side in the thickness direction) of the second terminal 31. The second upper surface cover 39A is disposed on at least the peripheral edge portions (to be specific, the front end portion, the right end portion, and the left end portion of the upper surface) continuing to the portions (to be specific, the front end surface 31B, the right end surface (not shown), and the left end surface (not shown)) of the peripheral end surface 31A that are not next to the base insulating layer 6 of the upper surface of the second terminal 31. In the embodiment, the second upper surface cover 39A expands on the entire upper surface of the second terminal 31.

The second peripheral surface cover 39B covers a portion that is not next to the base insulating layer 6 of the peripheral end surface 31A of the second terminal 31, and is disposed on the peripheral end surface 31A. The second peripheral surface cover 39B continues from the peripheral end portion of the second upper surface cover 39A and extends downwardly. In the embodiment, the second peripheral surface cover 39B covers at least a portion of the front end surface 31B, the right end surface (not shown), and the left end surface (not shown).

The range of the area of the peripheral end surface 31A that is covered with the second peripheral surface cover 39B is the same as that of the area of the peripheral end surface 30A that is covered with the first peripheral surface cover 37B described above.

The cover insulating layer 8 is formed from the same synthetic resin as that of the base insulating layer 6. Preferably, the cover insulating layer 8 is formed from a polyimide resin. The thickness of the cover insulating layer 8 is appropriately set.

2. Method for Producing Suspension Board with Circuit

Next, a method for producing the suspension board with circuit 1 is described with reference to FIGS. 5A to 6C.

Figure 5A:
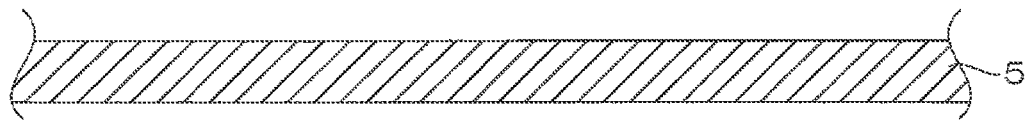
FIG. 5A shows an explanatory view for illustrating a method for producing the suspension board with circuit shown in FIG. 1 and shows a step of preparing a supporting board.

To produce the suspension board with circuit 1, as shown in FIG. 5A, the supporting board 5 is prepared.

Figure 5B:
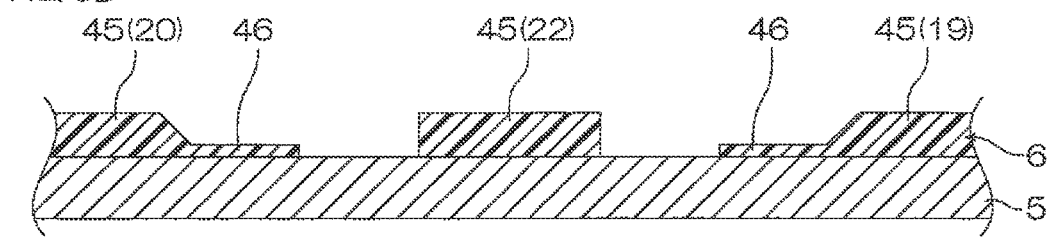
FIG. 5B, subsequent to FIG. 5A, shows a step of forming a base insulating layer including a thick portion and a thin portion on the supporting board.

Next, as shown in FIG. 5B, the base insulating layer 6 is formed on the upper surface (one side in the thickness direction) of the supporting board 5 so as to form a thick portion 45 and thin portions 46 by a gradation exposure to light.

To be specific, a varnish containing a photosensitive synthetic resin is applied onto the supporting board 5 to be then dried, thereby forming a base film. Thereafter, the base film is subjected to the gradation exposure to light via a photomask that is not shown; then, the base film is developed; and is cured by heating as needed.

In this manner, the thick portion 45 is formed in the portions corresponding to the above-described base insulating layer 6 (the first stage base 19, the second stage base 22, the third stage base 20, the outrigger base 23, and the external connecting base 24). The thin portions 46 are formed in the portions corresponding to the first terminals 30 and the second terminals 31 described above.

At this time, the thin portion 46 corresponding to the first terminal 30 is formed to extend rearwardly along the front-rear direction so as to go away from the thick portion 45 corresponding to the first stage base 19.

The thin portion 46 corresponding to the second terminal 31 is formed to extend forwardly along the front-rear direction so as to go away from the thick portion 45 corresponding to the third stage base 20.

Figure 5C:
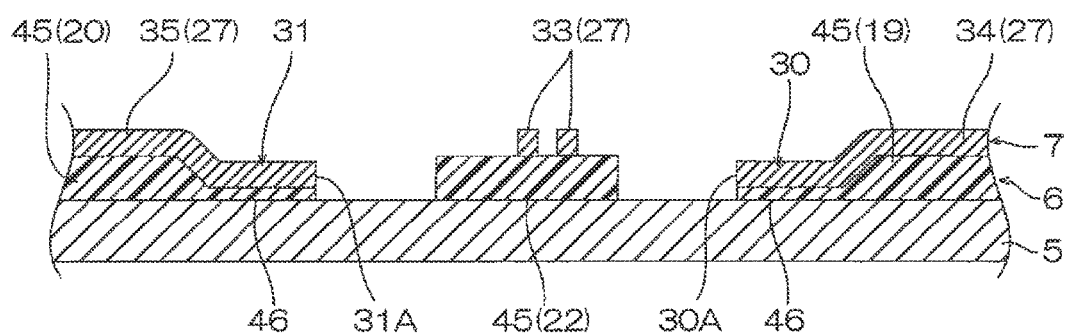
FIG. 5C, subsequent to FIG. 5B, shows a step of forming a conductive pattern on the base insulating layer.

Next, as shown in FIG. 5C, the conductive pattern 7 is formed on the base insulating layer 6 (the thick portion 45 and the thin portions 46) in the above-described pattern by, for example, an additive method or a subtractive method.

To be specific, the wire 27, the magnetic head terminal 28, the external connecting terminal 29, and the power source terminal 32 are formed on the upper surface (surface at one side in the thickness direction) of the thick portion 45, and the first terminal 30 and the second terminal 31 are formed on the upper surface (surface at one side in the thickness direction) of the thin portions 46.

In this manner, the first terminal 30 is formed on the upper surface of the thin portion 46 so as to be next to the rear side of the thick portion 45 corresponding to the first stage base 19 in the front-rear direction. The second terminal 31 is formed on the upper surface of the thin portion 46 so as to be next to the front side of the thick portion 45 corresponding to the third stage base 20 in the front-rear direction.

Figure 5D:
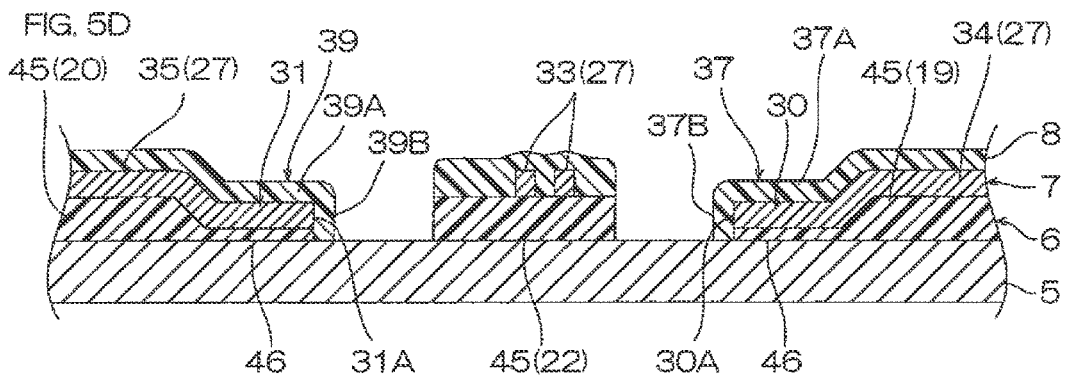
FIG. 5D, subsequent to FIG. 5C, shows a step of forming a cover insulating layer on the base insulating layer so as to cover a wire.

Next, as shown in FIG. 5D, the cover insulating layer 8 is formed on the upper surface (one side in the thickness direction) of the base insulating layer 6 in the above-described pattern.

To be specific, a varnish containing a photosensitive synthetic resin is applied onto the base insulating layer 6 and the conductive pattern 7 (excluding the magnetic head terminal 28, the external connecting terminal 29, and the power source terminal 32) to be then dried, thereby forming a cover film. Thereafter, the cover film is exposed to light to be developed, and is cured by heating as needed.

In this manner, the cover insulating layer 8 is formed so as to cover the wire 27, the first terminal 30, and the second terminal 31 and to expose the magnetic head terminal 28, the external connecting terminal 29, and the power source terminal 32.

To be more specific, the first upper surface cover 37A of the first terminal cover 37 covers the upper surface of the first terminal 30, and the first peripheral surface cover 37B of the first terminal cover 37 covers the peripheral end surface 30A of the first terminal 30.

Also, the second upper surface cover 39A of the second terminal cover 39 covers the upper surface of the second terminal 31 as described above, and the second peripheral surface cover 39B of the second terminal cover 39 covers the peripheral end surface 31A of the second terminal 31 as described above.

Next, as shown in FIG. 6A, the supporting board 5 is trimmed so as to have the above-described pattern. In this manner, the supporting board 5 that is positioned at the lower side of the thin portion 46 is removed, and the thin portion 46 is exposed from the lower side thereof.

Next, as shown in FIG. 6B, the thin portion 46 is removed by known etching (for example, wet etching or the like). In this manner, the lower surfaces of the first terminal 30 and the second terminal 31 are exposed from the base insulating layer 6.

At this time, along with the thin portion 46, each of the lower end portions of the first peripheral surface cover 37B and the second terminal cover 39 may be also subjected to etching.

Next, as shown in FIG. 6C, the plating layer 38 is formed on the lower surfaces of the first terminal 30 and the second terminal 31 by a known plating method (for example, electrolytic plating, nonelectrolytic plating, or the like).

In this manner, the suspension board with circuit 1 is produced.

3. Mounting of Piezoelectric Element on Suspension Board with Circuit

Next, the mounting of the piezoelectric elements 3 on the suspension board with circuit 1 is described with reference to FIGS. 7A to 7C.

As shown in FIG. 1, the piezoelectric element 3 is an actuator that is extendable and/or contractable in the front-rear direction. Electricity is supplied thereto and the voltage thereof is controlled, so that the piezoelectric element 3 extends and/or contracts. In the embodiment, the two piezoelectric elements 3 are mounted on the suspension board with circuit 1.

The piezoelectric element 3 is, for example, formed from a known piezoelectric material, to be more specific, piezoelectric ceramic or the like.

Examples of the piezoelectric ceramic include $BaTiO_3$ (barium titanate), $PbTiO_3$ (lead titanate), $Pb(Zr, Ti)O_3$ (lead zirconate titanate (PZT)), $SiO_2$ (crystal), $LiNbO_3$ (lithium niobate), and $PbNb_2O_6$ (lead metaniobate). Preferably, PZT is used.

As shown in FIG. 7B, the piezoelectric element 3 includes the first element terminal 40 and the second element terminal 41. The first element terminal 40 and the second element terminal 41 are disposed at spaced intervals to each other in the front-rear direction corresponding to the first terminal 30 and the second terminal 31.

To be more specific, the first element terminal 40 corresponds to the first terminal 30, and is provided in the front-side portion of the upper surface of the piezoelectric element 3. The first element terminal 40 has a generally rectangular shape when viewed from the top extending in the right-left direction.

The second element terminal 41 corresponds to the second terminal 31, and is provided in the rear-side portion of the upper surface of the piezoelectric element 3. The second element terminal 41 has a generally rectangular shape when viewed from the top extending in the right-left direction.

In the mounting of the piezoelectric element 3 on the suspension board with circuit 1, as shown in FIG. 7A, first, a solder composition 4A is prepared.

The solder composition 4A contains Sn, Ag, and Cu. Preferably, the solder composition 4A consists of only Sn, Ag, and Cu. In the following, the solder composition 4A is defined as a Sn—Ag—Cu solder composition.

In the Sn—Ag—Cu solder composition, the content ratio of Ag is, for example, 1 mass % or more, preferably 2 mass % or more, and for example, 5 mass % or less, preferably 4 mass % or less, further more preferably 3 mass % or less.

The content ratio (Ag/Cu) of Ag to Cu is, for example, 4 or more, preferably 5 or more, and for example, 8 or less, preferably 7 or less.

In the Sn—Ag—Cu solder composition, the content ratio of Cu is, for example, 0.3 mass % or more, preferably 0.4 mass % or more, and for example, 0.7 mass % or less, preferably 0.6 mass % or less, further more preferably 0.5 mass % or less.

In the Sn—Ag—Cu solder composition, the content ratio of Sn is the remaining content ratio of the above-described Ag and Cu.

To be specific, an example of the solder composition includes Sn-3Ag-0.5Cu. A commercially available product can be used as the solder composition.

The melting point of the solder composition is, for example, 200° C. or more, preferably 210° C. or more, and for example, 230° C. or less, preferably 220° C. or less.

The solder composition 4A is disposed on the lower surface of the plating layer 38 of the first terminal 30 and the lower surface of the plating layer 38 of the second terminal 31 by a known method (for example, printing with a known printer, application with a dispenser, or the like).

The volume of the solder composition 4A that is disposed on each of the terminals is, for example, $1 \times 10^{-8}$ cm$^3$ or more, preferably $1 \times 10^{-7}$ cm$^3$ or more, and for example, $1 \times 10^{-5}$ cm$^3$ or less, preferably $1 \times 10^{-6}$ cm$^3$ or less.

The solder composition 4A has the maximum thickness of, for example, 10 μm or more, preferably 20 μm or more, and for example, 60 μm or less, preferably 50 μm or less.

Next, as shown in FIG. 7B, the piezoelectric element 3 is disposed so that the first element terminal 40 is in contact with the solder composition 4A on the first terminal 30, and the second element terminal 41 is in contact with the solder composition 4A on the second terminal 31.

That is, the piezoelectric element 3 is disposed at the lower side (the other side in the thickness direction) with respect to the first terminal 30 and the second terminal 31. The piezoelectric element 3 is disposed between the first terminal 30 and the second terminal 31. At the upper side of the central portion in the front-rear direction of the piezoelectric element 3, the belt-shaped portion 14 of the second stage base 22 is disposed at spaced intervals thereto.

Next, as shown in FIG. 7C, the suspension board with circuit 1 on which the piezoelectric element 3 is disposed is subjected to reflow.

The reflow temperature is, for example, 230° C. or more, preferably 240° C. or more, and for example, 260° C. or less, preferably 250° C. or less. The reflow time is, for example, 3 seconds or more, preferably 5 seconds or more, and for example, 300 seconds or less, preferably 200 seconds or less.

In this manner, the solder composition 4A is melted so as to wet-spread on each of the entire lower surfaces of the first terminal 30 and the second terminal 31. At this time, the first peripheral surface cover 37B covers the peripheral end surface 30A of the first terminal 30, so that the wet-spreading of the solder composition 4A so as to cover the peripheral end surface 30A can be suppressed. Also, the second peripheral surface cover 39B covers the peripheral end surface 31A of the second terminal 31, so that the wet-spreading of the solder composition 4A so as to cover the peripheral end surface 31A can be suppressed.

Figure 8:
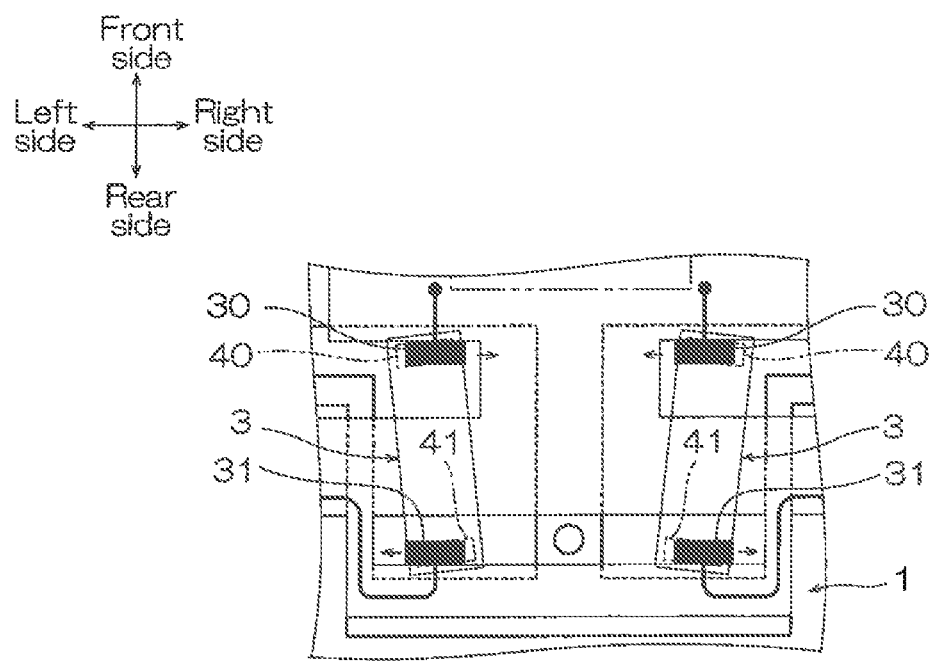
FIG. 8 shows an explanatory view for illustrating self-alignment of the piezoelectric element shown in FIG. 7C.

The piezoelectric element 3 is self-aligned. To be more specific, in the step of disposing the piezoelectric element 3 shown in FIG. 7B, as shown in FIG. 8, there may be a case where the piezoelectric element 3 deviates from a predetermined position, and is disposed so as to incline in the right-left direction. In this case, the center of the first element terminal 40 deviates from that of the first terminal 30, and the center of the second element terminal 41 deviates from that of the second terminal 31 when viewed in the up-down direction.

Next, when the suspension board with circuit 1 on which the piezoelectric element 3 is disposed is subjected to reflow, the solder composition 4A is melted so as to wet-spread on each of the entire lower surfaces of the first terminal 30 and the second terminal 31 (ref: FIG. 7C).

At this time, by the surface tension of the melted solder composition 4A, power is applied to the piezoelectric element 3 so that the center of the first element terminal 40 coincides with the center of the first terminal 30, and the center of the second element terminal 41 coincides with the center of the second terminal 31 when viewed in the up-down direction. In this manner, as shown in FIG. 2, the piezoelectric element 3 is self-aligned from a state where it deviates from the predetermined position toward the predetermined position.

As shown in FIG. 7C, the solder composition 4A forms a solder layer 4, and connects the first terminal 30 to the first element terminal 40 and connects the second terminal 31 to the second element terminal 41.

That is, the solder layer 4 is disposed between the first terminal 30 (to be more specific, the plating layer 38 of the first terminal 30) and the first element terminal 40, and the second terminal 31 (to be more specific, the plating layer 38 of the second terminal 31) and the second element terminal 41.

In this manner, the first terminal 30 is electrically connected to the first element terminal 40, and the second terminal 31 is electrically connected to the second element terminal 41.

The solder layer 4 has a thickness T of, for example, 3 μm or more, preferably 10 μm or more, and for example, 30 m or less, preferably 15 μm or less.

The volume of the solder layer 4 that is positioned between the first terminal 30 and the first element terminal 40 is, for example, $1 \times 10^{-8}$ cm$^3$ or more, preferably $1 \times 10^{-7}$ cm$^3$ or more, and for example, $1 \times 10^{-5}$ cm$^3$ or less, preferably $1 \times 10^{-6}$ cm$^3$ or less.

The volume of the solder layer 4 that is positioned between the first terminal 30 and the first element terminal 40 per unit area of the first terminal 30 is, for example, 0.0003 cm$^3$/cm$^2$ or more, preferably 0.0010 cm$^3$/cm$^2$ or more, and for example, 0.0030 cm$^3$/cm$^2$ or less, preferably 0.0015 cm$^3$/cm$^2$ or less.

When the volume of the solder layer 4 is the above-described lower limit or more, the piezoelectric element 3 can be surely self-aligned, and improvement of the position accuracy of the piezoelectric element 3 can be achieved. When the volume of the solder layer 4 is the above-described upper limit or less, a reduction in the thickness of the portion in which the piezoelectric element 3 is mounted can be surely achieved.

The range of the volume of the solder layer 4 that is positioned between the second terminal 31 and the second element terminal 41 is the same as that of the volume of the solder layer 4 that is positioned between the first terminal 30 and the first element terminal 40 described above.

In the above-described manner, the suspension board with circuit 1 on which the piezoelectric elements 3 are mounted is produced. The suspension board with circuit 1 includes the piezoelectric elements 3 and the solder layer 4 that connects the piezoelectric elements 3.

As shown in FIG. 1, the suspension board with circuit 1 may or may not include the slider 9 that has a magnetic head. When the suspension board with circuit 1 includes the slider 9, the slider 9 is disposed at the upper side (one side in the thickness direction) with respect to the first stage base 19. That is, the slider 9 is disposed at the opposite side to the piezoelectric element 3 with respect to the suspension board with circuit 1.

As shown in FIG. 4A, the rear end surface 30C, the right end surface 30D, and the left end surface 30E of the peripheral end surface 30A of the first terminal 30, and the front end surface 31B, the right end surface, and the left end surface of the peripheral end surface 31A of the second terminal 31 are covered with the cover insulating layer 8.

Thus, as shown in FIGS. 7A to 7C, when the piezoelectric element 3 is mounted on the suspension board with circuit 1, the wet-spreading of the solder composition 4A that is positioned between the first terminal 30 and the first element terminal 40 on the peripheral end surface 30A of the first terminal 30 can be suppressed, and the wet-spreading of the solder composition 4A that is positioned between the second terminal 31 and the second element terminal 41 on the peripheral end surface 31A of the second terminal 31 can be suppressed.

As a result, the amount of the solder composition 4A that is positioned between the first terminal 30 and the first element terminal 40, and between the second terminal 31 and the second element terminal 41 can be surely ensured.

Also, the first terminal 30 extends rearwardly along the front-rear direction so as to go away the first stage base 19, and the second terminal 31 extends forwardly along the front-rear direction so as to go away from the third stage base 20.

Thus, as shown in FIGS. 4A and 4B, the plurality of signal wires 33 can be drawn around toward the neighborhood of the first terminal 30, and the fine pitch of the conductive pattern 7 can be achieved. Also, an increase in the size of the first terminal 30 and the second terminal 31 can be achieved.

Also, the first terminal cover 37 covers the peripheral end surface 30A of the first terminal 30, and the second terminal cover 39 covers the peripheral end surface 31A of the second terminal 31. Thus, improvement of the adhesive properties of the first terminal cover 37 with the peripheral end surface 30A of the first terminal 30, and the adhesive properties of the second terminal cover 39 with the peripheral end surface 31A of the second terminal 31 can be achieved.

As a result, the fine pitch of the conductive pattern 7, and an increase in the size of the first terminal 30 and the second terminal 31 can be achieved, at least a portion of the peripheral end surfaces of the first terminal 30 and the second terminal 31 can be stably covered, and the piezoelectric element 3 can be mounted with excellent position accuracy.

The size of the first terminal 30 in the right-left direction with respect to that of the first terminal 30 in the front-rear direction is preferably twice or more and 8 times or less. The same is true of the size of the second terminal 31. Thus, an increase in the size of the first terminal 30 and the second terminal 31 in the right-left direction can be achieved.

As a result, as shown in FIGS. 7A to 7C, when the piezoelectric element 3 is mounted on the suspension board with circuit 1, improvement of the volume of the solder composition 4A that can be disposed on the first terminal 30 and the second terminal 31 can be achieved, and therefore, improvement of the position accuracy of the piezoelectric element 3 can be achieved.

As shown in FIGS. 5B to 6C, after the base insulating layer 6 is formed on the upper surface of the supporting board 5 so as to form the thick portion 45 and the thin portions 46 by a gradation exposure to light, each of the first terminal 30 and the second terminal 31 are formed on the upper surface of each of the thin portions 46 so as to be next to the thick portion 45 in the front-rear direction, and next, the cover insulating layer 8 is formed so as to cover at least a portion of the peripheral end surface 30A of the first terminal 30 and the peripheral end surface 31A of the second terminal 31. Thereafter, after the thin portions 46 are exposed by removing the supporting board 5, the first terminal 30 and the second terminal 31 are exposed by removing the thin portions 46. In this manner, the above-described suspension board with circuit 1 can be produced. That is, the suspension board with circuit 1 in which the fine pitch of the conductive pattern 7 and an increase in the size of the first terminal 30 and the second terminal 31 can be achieved, at least a portion of the peripheral end surfaces of the first terminal 30 and the second terminal 31 can be stably covered, and the piezoelectric element 3 can be mounted with excellent position accuracy can be smoothly produced.

Figure 10A:
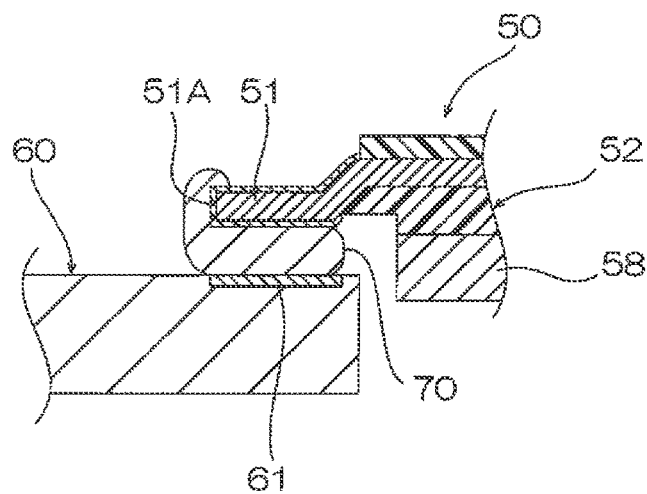
FIG. 10A shows an explanatory view of the prior art, and shows an embodiment in which a peripheral end surface of a piezoelectric-side terminal is exposed.
Figure 10B:
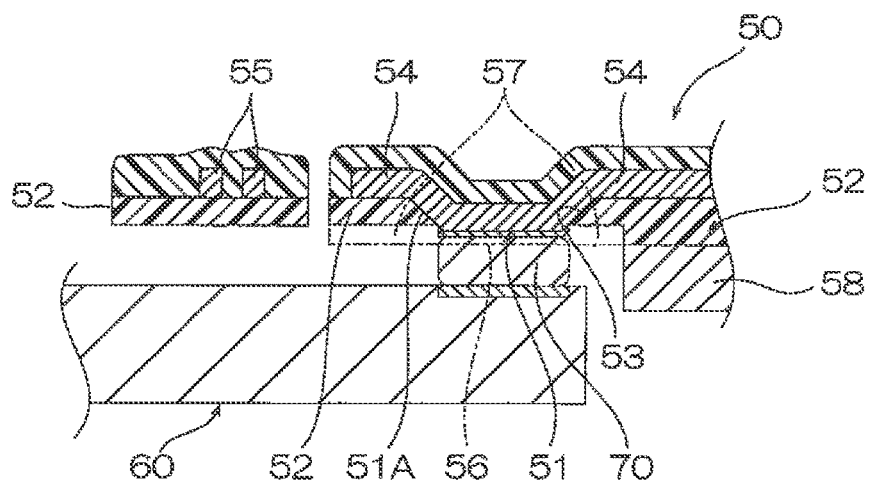
FIG. 10B shows an explanatory view of the prior art, and shows an embodiment in which the peripheral end surface of the piezoelectric-side terminal is covered with the base insulating layer and a continuous portion that continues to the piezoelectric-side terminal is disposed on the base insulating layer.
Figure 10C:
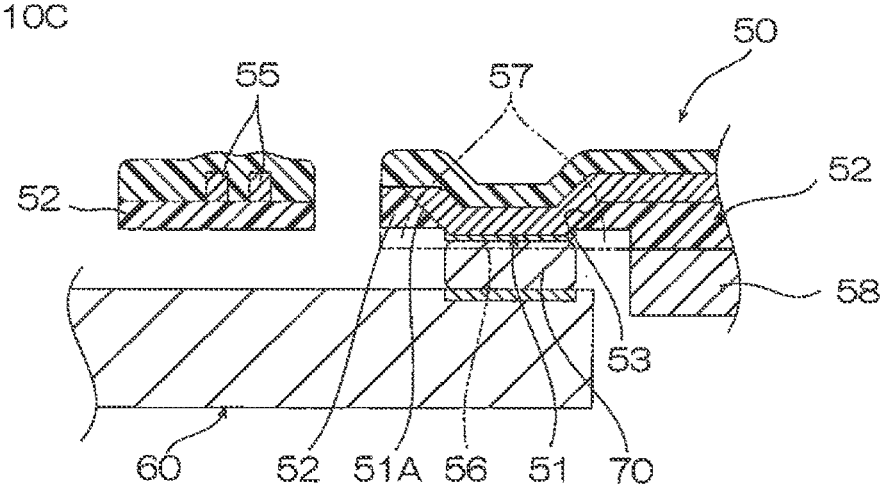
FIG. 10C shows an explanatory view of the prior art, and shows an embodiment in which the peripheral end surface of the piezoelectric-side terminal is covered with the base insulating layer and the continuous portion is removed.

As shown in FIGS. 10B and 10C, to form a piezoelectric-side terminal 51 at the inside of an opening 53 of a base insulating layer 52, for example, as shown by phantom lines, the base insulating layer 52 is formed on the upper surface of a supporting board 58 so as to form a thin portion 56 corresponding to the opening 53 and a thick portion 57 corresponding to the peripheral end portion of the opening 53 by a gradation exposure to light.

In this case, in the front-rear direction, the thick portion 57 is disposed so as to sandwich the thin portion 56, and both end portions in the front-rear direction of the thin portion 56 are connected to the thick portion 57. However, it is difficult to accurately form a connecting portion of the thin portion 56 to the thick portion 57 by the gradation exposure to light, and the size accuracy of the thin portion 56 may be unstable.

Thus, there is a disadvantage that the size accuracy of the piezoelectric-side terminal 51 that is formed on the thin portion 56 is reduced.

Meanwhile, in the embodiment, as shown in FIG. 5B, the thin portion 46 is formed to extend along the front-rear direction so as to go away from the thick portion 45, and only one end portion of the thin portion 46 in the front-rear direction continues to the thick portion 45.

Thus, compared to a case where both end portions in the front-rear direction of the thin portion 56 are connected to the thick portion 57, improvement of the size accuracy of the thin portion 46 can be achieved, and therefore, improvement of the size accuracy of the first terminal 30 and the second terminal 31 that are formed on the thin portions 46 can be achieved.

In this manner, when the piezoelectric element 3 is mounted, the piezoelectric element 3 can be stably self-aligned, and further improvement of the position accuracy of the piezoelectric element 3 can be achieved.

4. Modified Example

In the above-described embodiment, the cover insulating layer 8 covers both of the peripheral end surface 30A of the first terminal 30 and the peripheral end surface 31A of the second terminal 31, but the cover pattern is not limited thereto. The cover insulating layer 8 may cover only any one of the peripheral end surface 30A of the first terminal 30 and the peripheral end surface 31A of the second terminal 31.

In the above-described embodiment, the first terminal cover 37 covers the rear end surface 30C, the right end surface 30D, and the left end surface 30E of the peripheral end surface 30A of the first terminal 30, but the cover pattern is not limited thereto. The first terminal cover 37 may cover at least any one of the rear end surface 30C, the right end surface 30D, and the left end surface 30E. The second terminal cover 39 may cover at least any one of the front end surface 31B, the right end surface, and the left end surface.

In the modified example, the same function and effect as that of the above-described embodiment can be achieved.

EXAMPLES

In the following, the present invention will be described in detail with Example and Comparative Example, but the present invention is not limited thereto. The specific numerical values in mixing ratio (content ratio), property value, and parameter used in the following description will be replaced with upper limits (numerical values defined as "or less" or "below") or lower limits (numerical values defined as "or more" or "above") of corresponding numerical values in mixing ratio (content ratio), property value, and parameter described in the above-described "DETAILED DESCRIPTION OF THE INVENTION".

Example 1

A suspension board with circuit including two pairs of first terminal (size in the front-rear direction of the terminal/size in the front-rear direction of the element terminal: 100%, size in the right-left direction of the terminal/size in the right-left direction of the element terminal: 90%) and second terminal (size in the front-rear direction of the terminal/size in the front-rear direction of the element terminal: 100%, size in the right-left direction of the terminal/size in the right-left direction of the element terminal: 100%) was prepared.

In the suspension board with circuit, a cover insulating layer covered peripheral end surfaces (rear end surface, right end surface, and left end surface) of the first terminal and peripheral end surfaces (front end surface, right end surface, and left end surface) of the second terminal. To be more specific, the area of the peripheral end surfaces of the first terminal that were covered with the cover insulating layer with respect to 100% of the total area of the peripheral end surfaces of the first terminal was 30%. The area of the peripheral end surfaces of the second terminal that were covered with the cover insulating layer with respect to 100% of the total area of the peripheral end surfaces of the second terminal was 18%.

Next, $5 \times 10^{-7}$ cm$^3$ of Sn—Ag—Cu solder composition (Sn content ratio: remaining portion, Ag content ratio: 3±1 mass %, Cu content ratio: 0.5±0.1 mass %) was disposed on each of the lower surfaces of the first terminal and the second terminal.

Next, two piezoelectric elements, each of which included a first element terminal and a second element terminal, were prepared, and each of the piezoelectric elements was disposed so that the first element terminal was in contact with the solder composition on the first terminal, and the second element terminal was in contact with the solder composition on the second terminal.

Next, the suspension board with circuit on which the piezoelectric elements were disposed was put into a reflow oven and heated at 240° C. for 15 seconds. In this manner, the solder composition was melted so as to wet-spread on each of the entire lower surfaces of the first terminal and the second terminal, so that the piezoelectric element was self-aligned.

Thereafter, the solder composition formed a solder layer, and the first terminal was connected to the first element terminal and the second terminal was connected to the second element terminal.

In the above-described manner, the suspension board with circuit on which the piezoelectric elements were mounted was obtained. The same procedure was repeated, and twenty suspension boards with circuit were prepared.

Comparative Example 1

Twenty suspension boards with circuit on which the piezoelectric elements were mounted were prepared in the same manner as that in Example 1, except that in the suspension board with circuit, the cover insulating layer did not cover the peripheral end surface of the first terminal and that of the second terminal (ref: FIG. 10A).

<Evaluation>

In the following manner, the process capability index (Cpk) of each of the suspension boards with circuit of Example and Comparative Example was calculated. The Cpk shows the capacity of producing a product within a determined standard limit. The higher the numerical value is, the higher the production capacity is.

Based on the position of a first reference hole and a second reference hole, a Y-axis reference line (phantom line passing the center in the right-left direction of the suspension board with circuit along the front-rear direction) of the suspension board with circuit was specified.

Next, an X-axis reference line (phantom line passing the center of the first reference hole along the right-left direction) that was vertical to the Y-axis reference line and passed the center of the first reference hole was specified. The center of the first reference hole was defined as the reference (0, 0).

Next, a first phantom line along both end edges in the right-left direction of the piezoelectric element was extracted. Then, the angle (inclination θ) formed between the first phantom line (both end edges in the right-left direction of the piezoelectric element) and the Y-axis reference line was measured.

Next, a second phantom line along both end edges in the front-rear direction of the piezoelectric element was extracted. Then, the apexes (four corners) of the piezoelectric element were extracted from the intersection point of the first phantom line and the second phantom line.

Next, the central coordinate of the piezoelectric element was calculated from the coordinates of the apexes of the piezoelectric element. Then, the amount of deviation (amount of deviation of X-coordinate, amount of deviation of Y-coordinate) of the central coordinate of the piezoelectric element was calculated from the reference point (center of the first reference hole). Next, the average value of the inclination θ, the amount of deviation of X-coordinate, the amount of deviation of Y-coordinate in the plurality of suspension boards with circuit was calculated.

Also, the magnitude of dispersion (σ, standard deviation) of data of the inclination θ, the amount of deviation of X-coordinate, the amount of deviation of Y-coordinate was calculated.

Figure 11:
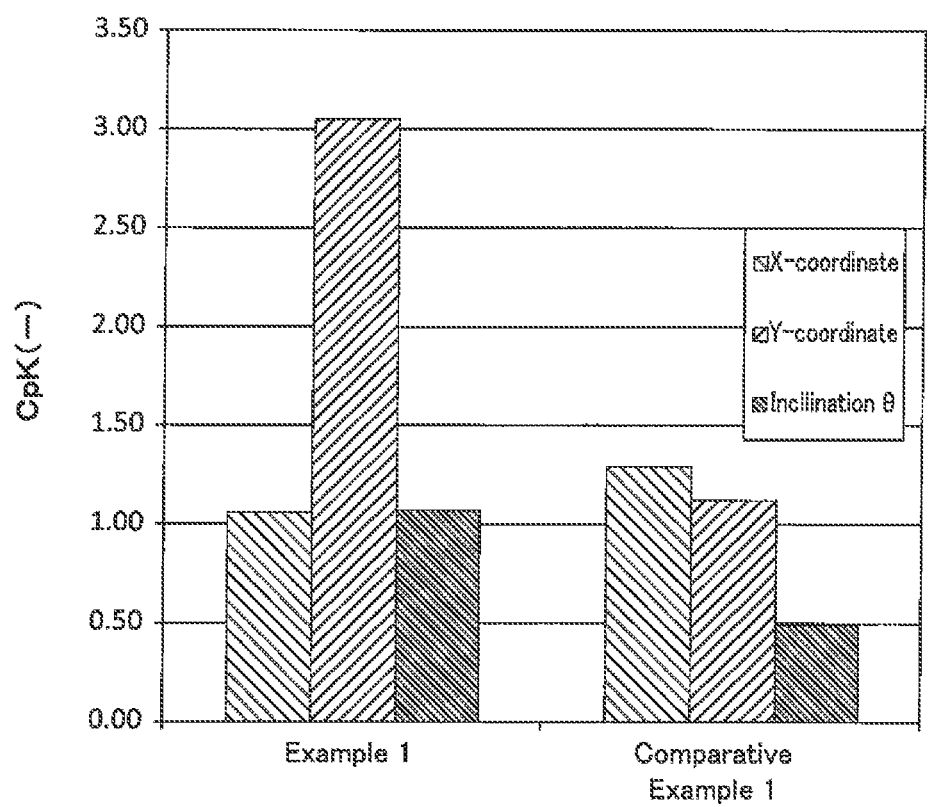
FIG. 11 shows a graph showing the process capability index (Cpk) at the time of mounting the piezoelectric element on the suspension board with circuit of Example 1 and Comparative Example 1.

Next, of the following formulas (1) and (2), the one having a smaller value was defined as Cpk. The results are shown in FIG. 11.

$$(\text{upper limit standard} - \text{average value})/3\sigma = \text{Cpu} \qquad \text{Formula (1)}$$

$$(\text{lower limit standard} - \text{average value})/3\sigma = \text{Cpl} \qquad \text{Formula (2)}$$

<Consideration>

As shown in FIG. 11, it was confirmed that compared to Comparative Example 1, in Example 1, improvement of the Cpk of the Y-coordinate and the inclination θ could be achieved.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A suspension board with circuit comprising:
a metal supporting layer,
a base insulating layer disposed at one side of the metal supporting layer in a thickness direction of the suspension board with circuit,
a conductive pattern including a wire disposed on the base insulating layer at the one side in the thickness direction, and
a cover insulating layer disposed on the base insulating layer at the one side in the thickness direction so as to cover the wire, wherein
the conductive pattern includes a terminal for being connected to a piezoelectric element, connected to the wire, and disposed next to the base insulating layer in a direction perpendicular to the thickness direction;
the terminal
is exposed from the metal supporting layer and the base insulating layer when viewed from an opposite side to the one side in the thickness direction, and
extends along the direction perpendicular to the thickness direction so as to go away from the base insulating layer next thereto and so as to have a peripheral end surface that faces a region over which the piezoelectric element is adapted to extend;
at least a portion of the peripheral end surface of the terminal is covered with a peripheral surface cover portion of the cover insulating layer, the peripheral surface cover portion extending in the thickness direction; and
the terminal is arranged as a whole so as not to overlap the metal supporting layer when projected in the thickness direction.

2. The suspension board with circuit according to claim 1, wherein
a size of the terminal in a width direction perpendicular to both directions of a direction in which the terminal extends and the thickness direction with respect to a size of the terminal in the direction in which the terminal extends is twice or more and 8 times or less.

* * * * *